United States Patent
Cheng (10) Patent No.: US 10,957,376 B1
(45) Date of Patent: Mar. 23, 2021

(54) REFRESH TESTING CIRCUIT AND METHOD

(71) Applicant: Winbond Electronics Corp., Taichung (TW)

(72) Inventor: Kan-Yuan Cheng, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/719,930

(22) Filed: Dec. 18, 2019

(51) Int. Cl.
*G11C 11/406* (2006.01)
*G11C 29/12* (2006.01)
*G11C 7/22* (2006.01)
*G11C 7/10* (2006.01)
*G11C 11/408* (2006.01)

(52) U.S. Cl.
CPC ...... *G11C 11/40607* (2013.01); *G11C 7/1072* (2013.01); *G11C 7/222* (2013.01); *G11C 11/408* (2013.01); *G11C 11/40618* (2013.01); *G11C 29/12015* (2013.01)

(58) Field of Classification Search
CPC .................................................. G11C 11/406
USPC ....................................................... 365/222
See application file for complete search history.

(56) References Cited

U.S. PATENT DOCUMENTS

| | | | | |
|---|---|---|---|---|
| 5,790,468 A | * | 8/1998 | Oh | G11C 29/02 365/222 |
| 5,943,280 A | * | 8/1999 | Tsukamoto | G11C 29/50 365/222 |
| 2002/0093504 A1 | * | 7/2002 | Pether | G06F 13/28 345/522 |
| 2008/0285370 A1 | * | 11/2008 | Okuyama | G11C 11/406 365/222 |
| 2015/0131389 A1 | * | 5/2015 | Furutani | G11C 8/12 365/189.05 |
| 2017/0161143 A1 | | 6/2017 | Reed et al. | |

FOREIGN PATENT DOCUMENTS

| | | |
|---|---|---|
| CN | 104143355 | 11/2014 |
| TW | I643199 | 12/2018 |

* cited by examiner

*Primary Examiner* — Min Huang
(74) *Attorney, Agent, or Firm* — JCIPRNET (57) ABSTRACT

A refresh testing circuit and method are provided. The refresh testing circuit includes an internal clock generator, a counter, and an address detection circuit. The internal clock generator transmits a control clock signal to a refresh controller to generate a bank selection signal and a row address signal for a refresh operation. The counter counts variations of the bank selection signal to generate a count value. The address detection circuit detects whether a value of the row address signal is sequentially increased during the refresh operations to generate a detection signal.

7 Claims, 6 Drawing Sheets

REFRESH TESTING CIRCUIT AND METHOD

BACKGROUND OF THE INVENTION

1. Field of the Invention

The invention relates to a memory testing device, in particular to a refresh testing circuit and method.

2. Description of Related Art

In a Dynamic Random Access Memory (DRAM), due to charge loss, memory banks need to be refreshed periodically to replenish new charge. The Dynamic Random Access Memory, for example, may provide all of the row addresses to be refreshed sequentially through a refresh controller. Therefore, the refresh controller must be tested during the memory production process to determine whether the refresh controller operates normally to ensure that each memory produced performs the refresh function normally.

In the prior art, when a refresh function is to be tested, refresh operation can be performed by writing new data from the outside to detect whether the refreshed data is correct. However, during the tests described above, the internal triggering of the precharge operation is typically prohibited to obtain sufficient time for the write operation. Therefore, some other control circuits are required to trigger the precharge operation. Compared with the normal refresh operation, the control time sequence may change and the time consumed will be longer.

SUMMARY OF THE INVENTION

The invention provides a refresh testing circuit and method, which can detect a refresh signal provided by a refresh controller through an additionally arranged circuit to test a refresh function without changing the original control time sequence.

The refresh testing circuit of the invention comprises an internal clock generator, a counter and an address detection circuit. The internal clock generator transmits a control clock signal to a refresh controller to generate a bank selection signal and a row address signal for a refresh operation. The counter is coupled to the refresh controller. The counter counts variations of the bank selection signal to generate a count value. The address detection circuit is coupled to the refresh controller and the counter. The address detection circuit detects whether a value of the row address signal is sequentially increased during the refresh operations, to generate a detection signal.

In one embodiment of the invention, the address detection circuit comprises a comparator, an AND gate and a flip-flop. A first input end of the comparator receives a count value and a second input end is coupled to the row address signal and the count value is compared with a value of the row address signal to output a comparison signal at an output end thereof. A first input end of the AND gate is coupled to the comparison signal. An input end of the flip-flop is coupled to an output end of the AND gate, a control end of the flip-flop is coupled to the bank selection signal, an output end of the flip-flop is coupled to a second input end of the AND gate, and outputs the detection signal.

The refresh testing method of the invention comprises: transmitting a control clock signal to a refresh controller to generate a bank selection signal and a row address signal for a refresh operation; counting variations of the bank selection signal to generate a count value; and detecting whether a value of the row address signal is sequentially increased during the refresh operations, to generate a detection signal.

Based on the above, the refresh testing circuit of the invention can detect the number of refresh operations of the memory bank and the address at which the refresh operation is performed by the counter and the address detection circuit. Therefore, the test of the refresh function can be completed in a short time without changing the original control time sequence.

In order to make the aforementioned and other objectives and advantages of the present invention comprehensible, embodiments accompanied with figures are described in detail below.

DESCRIPTION OF THE EMBODIMENTS

Figure 1:
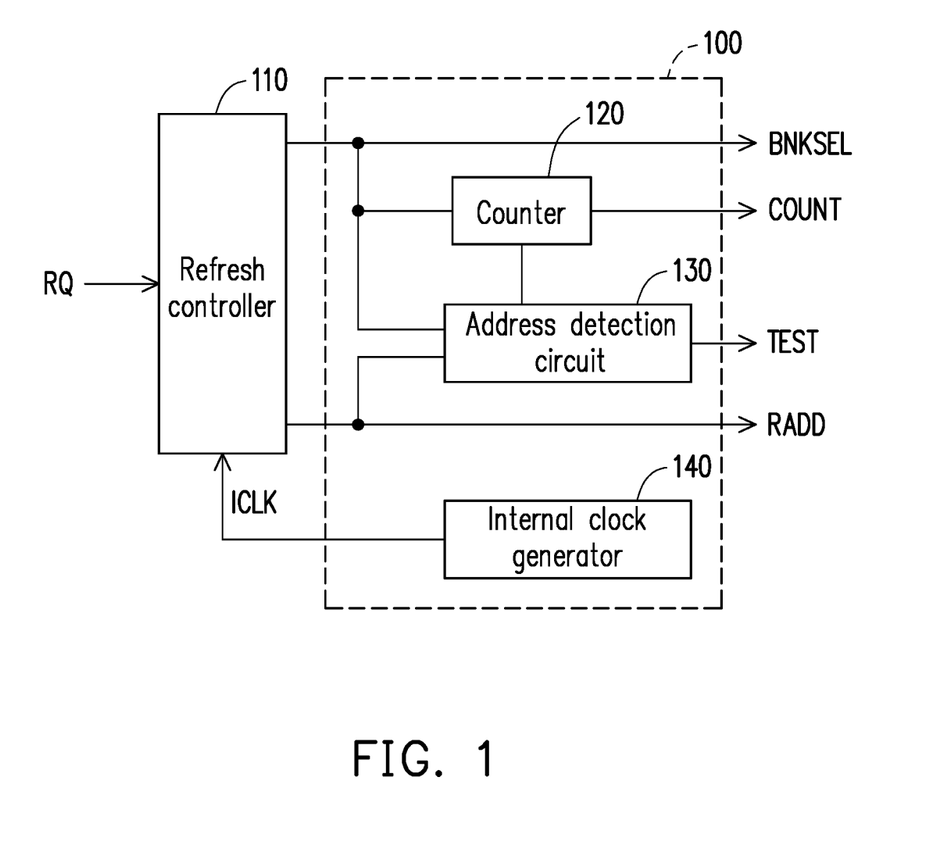
FIG. 1 is a schematic circuit diagram of a refresh testing circuit in accordance with one embodiment of the invention.

Referring to FIG. 1, which is a schematic circuit diagram of a refresh testing circuit in accordance with one embodiment of the invention. A refresh testing circuit 100 is built into a Dynamic Random Access Memory (DRAM), for example, to test its refresh function. As shown in FIG. 1, the refresh testing circuit 100 includes a counter 120, an address detection circuit 130, and an internal clock generator 140. In this embodiment, the refresh testing circuit 100 is configured to test the signals generated by a refresh controller 110.

For example, when the DRAM in which the refresh testing circuit 100 is built is to perform a refresh operation, the refresh controller 110 may receive a refresh request signal RQ and generate a bank selection signal BNKSEL and a row address signal RADD for the refresh operation according to the refresh request signal RQ. When a particular memory bank is selected to perform a refresh operation, the refresh controller 110 may enable a corresponding bank selection signal BNKSEL (e.g., rising to a high logic level) and output the row address signal RADD to specify the address to be refreshed. In this embodiment, the refresh controller 110 is, for example, a logic circuit composed of a plurality of logic gates, but the invention is not limited thereto.

The internal clock generator 140 is coupled to the refresh controller 110. The internal clock generator 140 may transmit a control clock signal ICLK to the refresh controller 110 to generate a bank selection signal BNKSEL and a row address signal RADD for the refresh operation. Therefore, the refresh controller 110 may receive the control clock signal ICLK and generate bank selection signal BNKSEL and the row address signal RADD in response to the control clock signal ICLK.

The counter 120 is coupled to the refresh controller 110. The counter 120 may count variations of the bank selection signal BNKSEL to produce a count value COUNT. For example, when the bank selection signal BNKSEL rises from a low logic level to a high logic level, the counter 120 accumulates the count value COUNT.

The address detection circuit 130 is coupled to the refresh controller 110 and the counter 120. The address detection circuit 130 may detect whether a value of the row address signal RADD is sequentially increased during the refresh operations, to generate a detection signal TEST. Specifically, since the DRAM needs to be refreshed sequentially for each address, the refresh controller 110 may correspondingly sequentially increase the value of the row address signal RADD. The address detection circuit 130 may then detect whether the refresh controller 110 has output the correct row address signal RADD and output the corresponding detection signal TEST.

Figure 2:
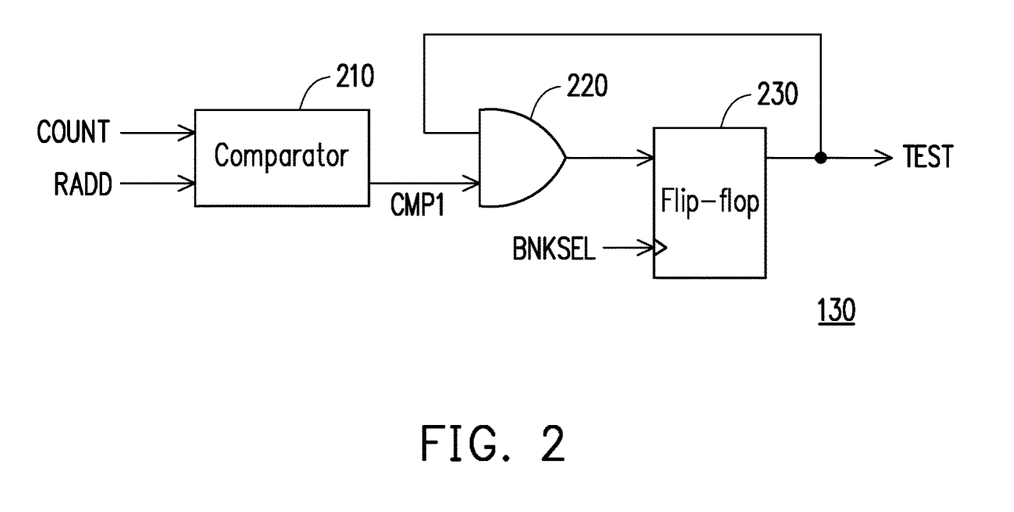
FIG. 2 is a schematic circuit diagram of an address detection circuit in accordance with one embodiment of the invention.

For example, FIG. 2 is a schematic circuit diagram of an address detection circuit in accordance with one embodiment of the invention. In this embodiment, the address detection circuit 130 includes a comparator 210, an AND gate 220, and a flip-flop 230. A first input end of the comparator 210 receives the count value COUNT and a second input end of the comparator 210 is coupled to the row address signal RADD. The comparator 210 may compare the count value COUNT with the value of the row address signal RADD to output a comparison signal CMP1 at its output end. In this embodiment, when the count value COUNT is equal to the value of the row address signal RADD, the comparator 210 outputs a comparison signal CMP1 having a value of logic 1 (high logic level). When the count value COUNT is not equal to the value of the row address signal RADD, the comparator 210 outputs a comparison signal CMP1 having a value of logic 0 (low logic level).

A first input end of the AND gate 220 is coupled to the comparison signal CMP1. An input end of the flip-flop 230 is coupled to an output end of the AND gate 220. A control end of the flip-flop 230 is coupled to a bank selection signal BNKSEL. Therefore, the flip-flop 230 stores an output value of the AND gate 220 according to the bank selection signal BNKSEL and outputs the same as the detection signal TEST.

In addition, an output end of the flip-flop 230 is coupled to a second input end of the AND gate 220. The initial value of the output detection signal TEST is logic 1 (high logic level). Based on the above structure, once the comparison signal CMP1 output from the comparator 210 becomes logic 0 (low logic level), the detection signal TEST output from the flip-flop 230 becomes logic 0 (low logic level). Also, since the detection signal TEST is fed back to the AND gate 220, the detection signal TEST having a value of logic 0 (low logic level) continues until the end of the test to notify a user of a test error.

Therefore, the user can determine whether the number of refresh operations of the memory bank is correct or not according to the count value COUNT, and determine whether the address for each refresh operation is correct or not according to the detection signal TEST to test the refresh function.

Since no additional write operation or read operation is needed in this embodiment, and the precharge operation can be normally triggered internally, the control time sequence of the original normal refresh operation does not need to be changed when the refresh test is performed. In addition, since memory array is not involved in the test, control clock signal ICLK can run faster than normal refresh operation during test. For example, the internal clock generator 140 may be dual-frequency and can generates dual-frequency clocks. Therefore, when the internal clock generator 140 output a faster clock, the refresh controller 110 can run at a faster clock frequency, the refresh test can be completed in a short time.

Figure 3A:
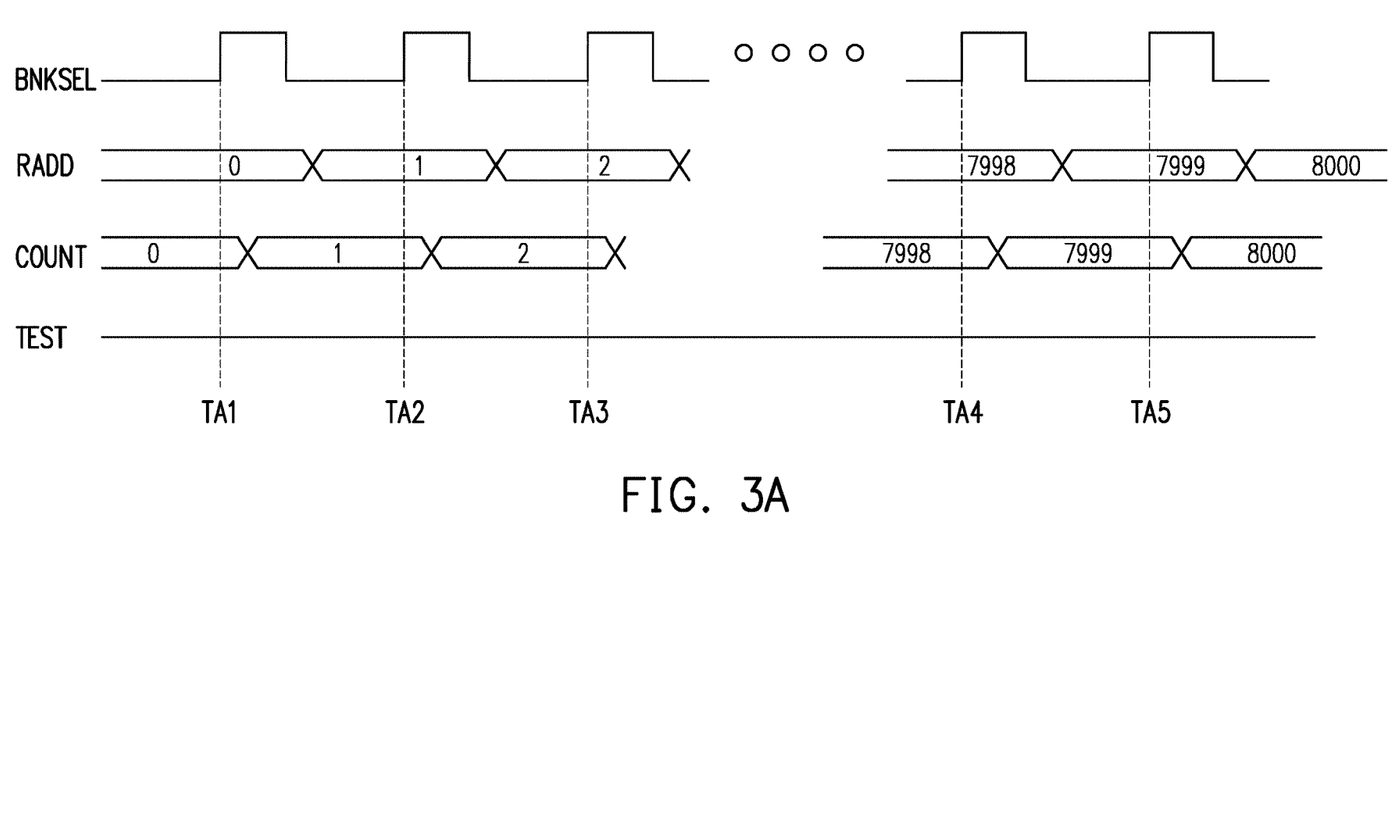
FIGS. 3A and 3B are schematic waveform diagrams of a refresh test in accordance with one embodiment of the invention.
Figure 3B:
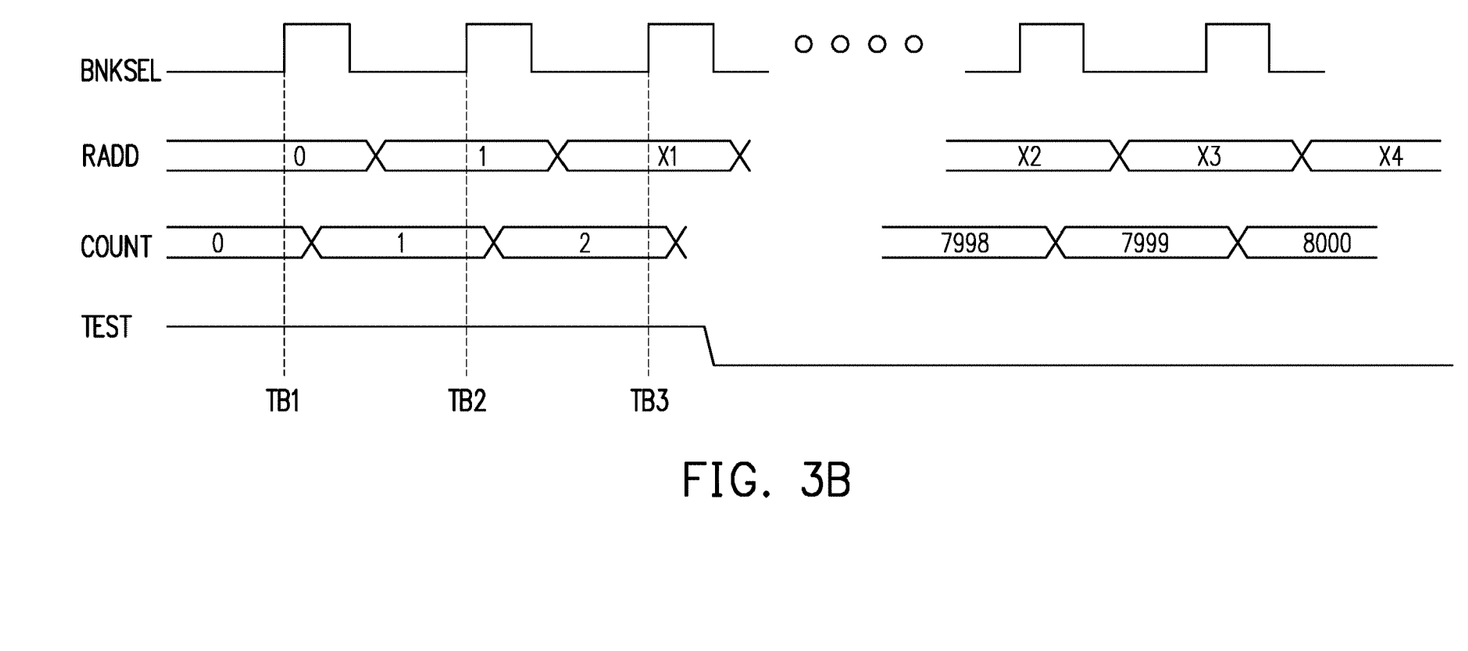

FIGS. 3A and 3B are schematic waveform diagrams of a refresh test in accordance with one embodiment of the invention. Hereinafter, the refresh testing method adapted for a DRAM according to the invention will be described with reference to FIG. 1, FIG. 2 and FIGS. 3A-3B.

The waveform shown in FIG. 3A is, for example, a waveform during normal operation of the refresh function. In FIG. 3A, when the refresh controller 110 receives a refresh request signal RQ requesting a refresh operation (i.e., time point TA1), the refresh controller 110 generates a bank selection signal BNKSEL and a row address signal RADD. Specifically, at the time point TA1, the refresh controller 110 may begin selecting memory banks to be refreshed and switching the logic level of the bank selection signal BNKSEL. In addition, between two rising edges of the bank selection signal BNKSEL (e.g., between time points TA1 and TA2), the refresh controller 110 accumulates the value of the row address signal RADD to refresh the next address.

On the other hand, after the bank selection signal BNKSEL rises to a high logic level (e.g., time point TA1), the counter 120 accumulates the count value COUNT to count the number of refresh operations. In this embodiment, for convenience of explanation, both the initial value of the row address signal RADD and the initial value of the count value COUNT are set to 0, but the invention is not limited thereto.

The address detection circuit 130 of the invention may be triggered by the rising edges of the bank selection signal BNKSEL to begin detection. As shown in FIG. 3A, at the time point TA1, since the count value COUNT and the value of the row address signal RADD are both 0, the comparator 210 in FIG. 2 outputs a comparison signal CMP1 having a value of logic 1 (high logic level). At this time, since the initial value of the detection signal TEST is logic 1, the output value of the AND gate 220 can be maintained at logic 1. Therefore, at the time point TA1, the flip-flop 230 storing the output value of the AND gate 220 outputs a detection signal TEST having a value of logic 1 (high logic level). By analogy, at time points TA2, TA3, TA4 and TA5 in FIG. 3A, the count value COUNT is equal to the value of the row address signal RADD, so that the detection signal TEST maintains at logic 1 (high logic level) to indicate that the refresh function has passed the test.

The waveform shown in FIG. 3B is, for example, a waveform when the refresh controller 110 outputs an erroneous row address signal RADD resulting in an abnormal refresh function. In FIG. 3B, when the refresh controller 110 receives a refresh request signal RQ requesting a refresh operation (i.e., time point TB1), the refresh controller 110 generates a bank selection signal BNKSEL and a row address signal RADD. Specifically, at time point TB1, the refresh controller 110 may begin selecting memory banks to be refreshed and switching the logic level of the bank selection signal BNKSEL. In addition, between the two rising edges of the bank selection signal BNKSEL (e.g., between time points TB1 and TB2), the refresh controller 110 accumulates the value of the row address signal RADD to refresh the next address.

Unlike the waveform in FIG. 3A, between the time points TB2 and TB3, the refresh controller 110 accumulates the value of the row address signal RADD to an abnormal value X1 instead of 2. Therefore, in the address detection circuit 130 that starts detection triggered by the rising edges of the bank selection signal BNKSEL at the time point TB3, since the count value COUNT is not equal to the value of the row address signal RADD, the comparison signal CMP1 output by the comparator 210 is logic 0 (low logic level). The comparator 210 in FIG. 2 outputs a comparison signal CMP1 having a value of logic 0 (low logic level), causing the output value of the AND gate 220 to become logic 0, so that the detection signal TEST output by the flip-flop 230 also becomes logic 0 (low logic level), and continues until the end of the test to notify the user of a test error.

In FIG. 3B, the abnormal values X1-X4 represent only the values of the row address signal RADD that are not equal to the corresponding count values COUNT, and the abnormal values Y1-Y4 represent only the count values COUNT that are not equal to the values of the corresponding row address signal RADD, and the invention does not limit the above abnormal values.

Figure 4:
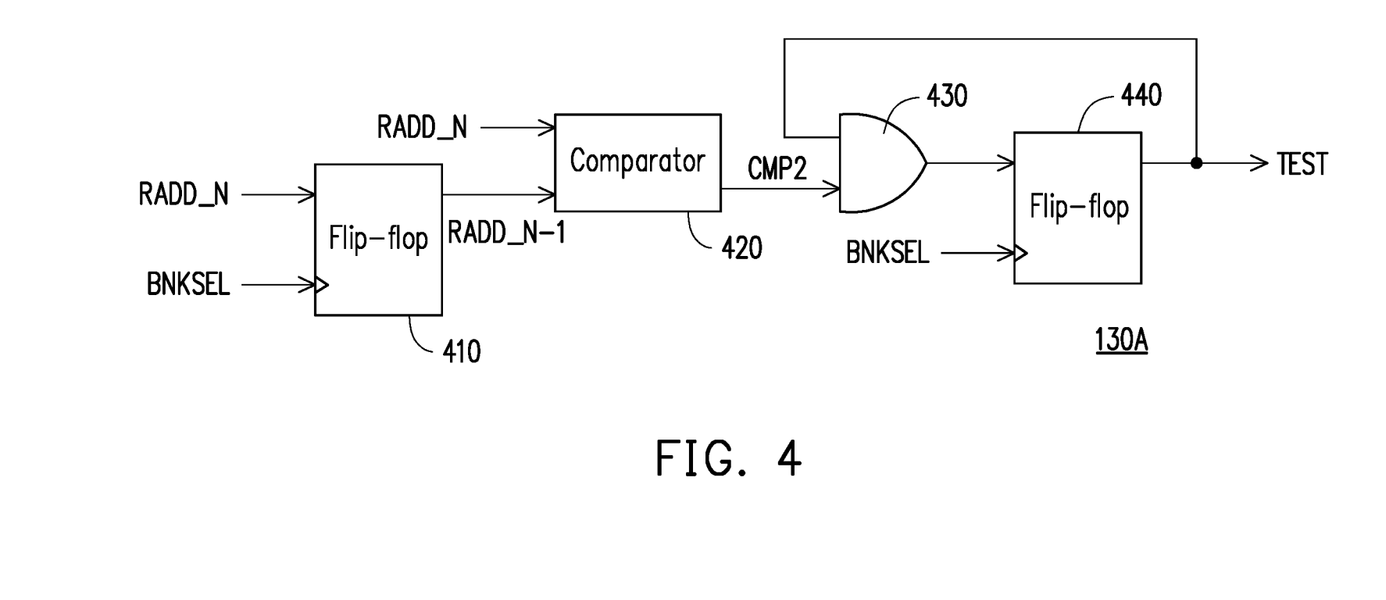
FIG. 4 is a schematic circuit diagram of an address detection circuit in accordance with another embodiment of the invention.

FIG. 4 is a schematic circuit diagram of an address detection circuit in accordance with another embodiment of the invention. In this embodiment, the address detection circuit 130A includes a flip-flop 410, a comparator 420, an AND gate 430, and a flip-flop 440. An input end of the flip-flop 410 is coupled to a current row address signal RADD_N, and a control end of the flip-flop 410 is coupled to the bank selection signal BNKSEL.

A first input end of the comparator 420 is coupled to the current row address signal RADD_N, and a second input end of the comparator 420 is coupled to an output end of the flip-flop 410. The comparator 420 may compare a value of the current row address signal RADD_N with a value of the previous (previous) row address signal RADD_N−1 stored in the flip-flop 410 to output a comparison signal CMP2 at its output end. In this embodiment, the comparator 420 outputs a comparison signal CMP2 having a value of logic 1 (high logic level) when the value of the current row address signal RADD_N minus the value of the previous row address signal RADD_N−1 is equal to 1. The comparator 420 outputs a comparison signal CMP2 having a value of logic 0 (low logic level) when the value of the current row address signal RADD_N minus the value of the previous row address signal RADD_N−1 is not equal to 1.

A first input end of the AND gate 430 is coupled to the comparison signal CMP2. An input end of the flip-flop 440 is coupled to an output end of the AND gate 430. A control end of the flip-flop 440 is coupled to a bank selection signal BNKSEL. Therefore, the flip-flop 440 stores the output value of the AND gate 430 according to the bank selection signal BNKSEL and outputs the same as the detection signal TEST.

Further, an output end of the flip-flop 440 is coupled to a second input end of the AND gate 430, and the initial value of the output detection signal TEST is logic 1 (high logic level). Based on the above structure, once the comparison signal CMP2 output by the comparator 420 becomes logic 0 (low logic level), the detection signal TEST output by the flip-flop 440 becomes logic 0 (low logic level). Also, since the detection signal TEST is fed back to the AND gate 430, the detection signal TEST having a value of logic 0 (low logic level) continues until the end of the test to notify the user of a test error.

Figure 5:
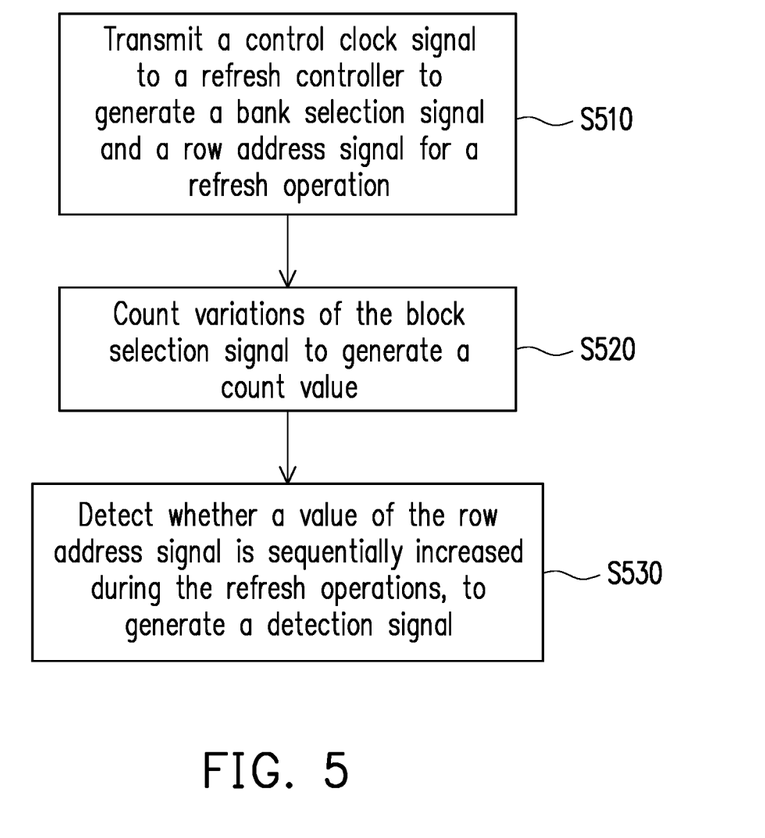
FIG. 5 is a flow diagram illustrating a refresh testing method in accordance with one embodiment of the invention.

FIG. 5 is a flow diagram illustrating a refresh testing method in accordance with one embodiment of the invention. Referring to FIG. 5, a refresh testing method for a DRAM in this embodiment includes the following steps: receiving a refresh request signal, and generating a bank selection signal and a row address signal for a refresh operation according to the refresh request signal (step S510); next, counting variations of the bank selection signal to generate a count value (step S520); and finally, detecting whether a value of the row address signal is sequentially increased during the refresh operations, to generate a detection signal (step S530). The implementation details of the above steps of S510, S520 and S530 are described in detail in the foregoing embodiments and the description, and the descriptions thereof are omitted herein.

Based on the foregoing, the refresh testing circuit of the invention can detect the number of refresh operations of the memory bank and the address at which the refresh operation is performed by the counter and the address detection circuit. Accordingly, since no additional write operation or read operation is performed for the refresh test, the control time sequence of the original normal refresh operation does not need to be changed when the refresh test is performed, and the refresh control clock can run faster than in normal refresh operation, refresh test can be completed in a short time.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:
1. A refresh testing circuit, comprising:
an internal clock generator, configured to transmit a control clock signal to a refresh controller to generate a bank selection signal and a row address signal for a refresh operation;
a counter, coupled to the refresh controller and configured to count variations of the bank selection signal to generate a count value; and
an address detection circuit, coupled to the refresh controller and the counter and configured to detect whether a value of the row address signal is sequentially increased during the refresh operations, to generate a detection signal,
wherein the address detection circuit comprise a comparator, wherein a first input end of the comparator receives the count value, a second input end of the comparator is coupled to the row address signal and the count value is compared with the value of the row address signal to output a comparison signal at an output end of the comparator, wherein address detection circuit generates the detection signal based on the comparison signal.
2. The refresh testing circuit according to claim 1, wherein the internal clock generator is dual-frequency.
3. The refresh testing circuit according to claim 1, wherein the address detection circuit further comprises:
an AND gate, wherein a first input end of the AND gate is coupled to the comparison signal; and
a flip-flop, wherein an input end of the flip-flop is coupled to an output end of the AND gate, a control end of the flip-flop is coupled to the bank selection signal, an output end of the flip-flop is coupled to a second input end of the AND gate, and the output end of the flip-flop outputs the detection signal.
4. A refresh testing method comprising:
transmitting a control clock signal to a refresh controller to generate a bank selection signal and a row address signal for a refresh operation;

counting variations of the bank selection signal to generate a count value; and detecting whether a value of the row address signal is sequentially increased during the refresh operations, to generate a detection signal, wherein the step of detecting whether the value of the row address signal is sequentially increased during the refresh operations to generate the detection signal comprises:

comparing the count value with the value of the row address signal to output a comparison signal; and determining, according to the comparison signal, whether the value of the row address signal is sequentially increased, to generate the detection signal.

5. A refresh testing circuit, comprising:

an internal clock generator, configured to transmit a control clock signal to a refresh controller to generate a bank selection signal and a row address signal for a refresh operation;

a counter, coupled to the refresh controller and configured to count variations of the bank selection signal to generate a count value; and an address detection circuit, coupled to the refresh controller and the counter and configured to detect whether a value of the row address signal is sequentially increased during the refresh operations, to generate a detection signal, wherein the address detection circuit comprises:

a first flip-flop, wherein an input end of the first flip-flop is coupled to the row address signal, and a control end of the first flip-flop is coupled to the bank selection signal;

a comparator, wherein a first input end of the comparator is coupled to the row address signal, a second input end of the comparator is coupled to an output end of the first flip-flop, a value of the current row address signal is compared with a value of the previous row address signal stored in the first flip-flop, to output a comparison signal at an output end of the comparator, wherein address detection circuit generates the detection signal based on the comparison signal.

6. The refresh testing circuit according to claim 5, wherein the address detection circuit further comprises:

an AND gate, wherein a first input end of the AND gate is coupled to the comparison signal; and a second flip-flop, wherein an input end of the second flip-flop is coupled to an output end of the AND gate, a control end of the second flip-flop is coupled to the bank selection signal, an output end of the second flip-flop is coupled to a second input end of the AND gate, and the output end of the second flip-flop outputs the detection signal.

7. A refresh testing method comprising:

transmitting a control clock signal to a refresh controller to generate a bank selection signal and a row address signal for a refresh operation;

counting variations of the bank selection signal to generate a count value; and detecting whether a value of the row address signal is sequentially increased during the refresh operations, to generate a detection signal, wherein the step of detecting whether the value of the row address signal is sequentially increased during the refresh operations to generate the detection signal comprises:

comparing a value of the current row address signal with a value of the previous row address signal stored in a flip-flop to output a comparison signal; and determining, according to the comparison signal, whether the value of the row address signal is sequentially increased, to generate the detection signal.

\* \* \* \* \*